United States Patent
Li et al.

(10) Patent No.: US 11,469,388 B2
(45) Date of Patent: Oct. 11, 2022

(54) ELECTROLUMINESCENT DEVICE AND LIGHT-EMITTING LAYER AND APPLICATION THEREOF

(71) Applicant: GUANGDONG JUHUA PRINTED DISPLAY TECHNOLOGY CO., LTD., Guangzhou (CN)

(72) Inventors: Zhe Li, Guangzhou (CN); Xiangwei Xie, Guangzhou (CN); Jingyao Song, Guangzhou (CN); Dong Fu, Guangzhou (CN)

(73) Assignee: GUANGDONG JUHUA PRINTED DISPLAY TECHNOLOGY CO., LTD, Guangzhou (CN)

( * ) Notice: Subject to any disclaimer, the term of this patent is extended or adjusted under 35 U.S.C. 154(b) by 0 days.

(21) Appl. No.: 16/637,416

(22) PCT Filed: Jan. 25, 2018

(86) PCT No.: PCT/CN2018/074173
§ 371 (c)(1),
(2) Date: Feb. 7, 2020

(87) PCT Pub. No.: WO2019/029135
PCT Pub. Date: Feb. 14, 2019

(65) Prior Publication Data
US 2020/0227664 A1    Jul. 16, 2020

(30) Foreign Application Priority Data
Aug. 8, 2017   (CN) .......................... 201710670753.7

(51) Int. Cl.
*H01L 51/00* (2006.01)
*H01L 51/50* (2006.01)

(52) U.S. Cl.
CPC ........ *H01L 51/502* (2013.01); *H01L 51/0067* (2013.01); *H01L 51/0003* (2013.01)

(58) Field of Classification Search
CPC .............. H01L 51/502; H01L 51/0067; H01L 51/0003; H01L 51/0072; H01L 51/0037;
(Continued)

(56) References Cited

U.S. PATENT DOCUMENTS

| | | | |
|---|---|---|---|
| 2012/0153330 A1* | 6/2012 | Tsutsui | H01L 33/46 257/98 |
| 2014/0034938 A1* | 2/2014 | Ishibashi | C07D 239/26 257/40 |

(Continued)

FOREIGN PATENT DOCUMENTS

| | | |
|---|---|---|
| CN | 105870347 A | 8/2016 |
| CN | 105957971 A | 9/2016 |

(Continued)

OTHER PUBLICATIONS

Ivaniuk et al., "BaZrO3 perovskite nanoparticles as emissive material for organic/inorganic hybrid light-emitting diodes" Dyes and Pigments vol. 145, Oct. 2017, pp. 399-403, (Available online Jun. 20, 2017). "https://www.sciencedirect.com/science/article/pii/S0143720817309518#bib16". (Year: 2017).*

(Continued)

*Primary Examiner* — Mary A Wilczewski
*Assistant Examiner* — Tsz K Chiu
(74) *Attorney, Agent, or Firm* — Dorsey & Whitney LLP

(57) ABSTRACT

An electroluminescent device and a light-emitting layer and an application thereof. The light-emitting layer comprises at least one nano-crystalline semiconductor material and at least one exciplex; an emission spectrum of the exciplex is at least partially overlapped with an excitation spectrum of the nano-crystalline semiconductor material; and the attenu- (Continued)

ation life of an excited state of the exciplex is longer than the attenuation life of an excited state of the nano-crystalline semiconductor material.

8 Claims, 1 Drawing Sheet

(58) Field of Classification Search
CPC ............ H01L 51/0042; H01L 51/5028; H01L 51/504; H01L 51/5262; H01L 51/442; H01L 51/5004; H01L 51/5012; H01L 51/506; H01L 51/5016; H01L 51/0094; H01L 51/0071; H01L 51/0085; H01L 51/0035; H01L 51/004
See application file for complete search history.

(56) References Cited

U.S. PATENT DOCUMENTS

| | | | | |
|---|---|---|---|---|
| 2015/0311446 A1* | 10/2015 | Inoue | .................. | H01L 51/0072 257/40 |
| 2016/0028022 A1* | 1/2016 | Seo | ..................... | C07D 403/14 257/40 |
| 2016/0075718 A1* | 3/2016 | Mitsumori | ............. | H05B 33/14 546/276.7 |
| 2016/0211466 A1* | 7/2016 | Ogiwara | ............. | C07D 493/04 |
| 2016/0248033 A1* | 8/2016 | Uesaka | ................ | H01L 51/504 |
| 2016/0268534 A1* | 9/2016 | Hosoumi | ............ | H01L 51/5012 |
| 2017/0062731 A1* | 3/2017 | Ogiwara | ............. | C07D 487/14 |
| 2017/0069852 A1* | 3/2017 | Kanamoto | .......... | H01L 51/0072 |
| 2017/0092889 A1* | 3/2017 | Seo | ........................ | C09K 11/06 |
| 2017/0125707 A1* | 5/2017 | Yamaguchi | .......... | H01L 51/0085 |
| 2017/0186971 A1* | 6/2017 | Kanamoto | .......... | H01L 51/0074 |
| 2017/0346029 A1* | 11/2017 | Kim | ..................... | H01L 51/5004 |
| 2018/0033987 A1* | 2/2018 | Kim | ..................... | H01L 51/5012 |
| 2018/0233688 A1* | 8/2018 | Chen | .................... | H01L 51/5072 |
| 2020/0295288 A1* | 9/2020 | Fusella | ................ | H01L 51/5262 |
| 2021/0273127 A1* | 9/2021 | Khan | .................... | H01L 27/302 |
| 2021/0280730 A1* | 9/2021 | Khan | ................... | H01L 31/0325 |

FOREIGN PATENT DOCUMENTS

| | | |
|---|---|---|
| CN | 106229423 A | 12/2016 |
| CN | 106997926 A | 8/2017 |
| CN | 106997927 A | 8/2017 |
| JP | 2012231154 A | 11/2012 |
| JP | 2013258402 A5 | 6/2016 |
| JP | 2017050720 A | 3/2017 |
| JP | 2017120903 A | 7/2017 |
| KR | 20120018865 A | 3/2012 |
| KR | 20160110170 A | 9/2016 |
| WO | 2016116527 A1 | 7/2016 |

OTHER PUBLICATIONS

International Search Report from International Application No. PCT/CN2018/074173 dated May 14, 2018.
Hung, Wen-Yi et al., "The First Tandem, All-exciplex-based WOLED", Jun. 4, 2014.

* cited by examiner

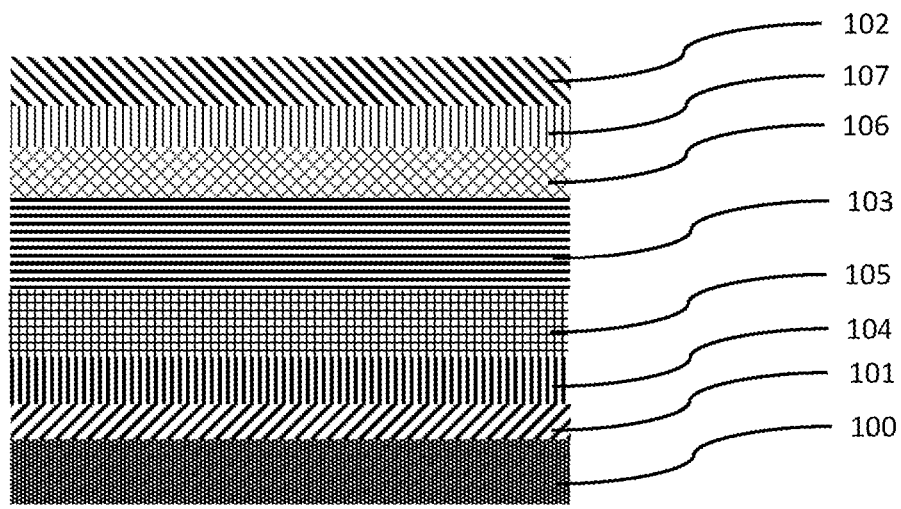

ELECTROLUMINESCENT DEVICE AND LIGHT-EMITTING LAYER AND APPLICATION THEREOF

TECHNICAL FIELD

The present disclosure relates to the technical field of a luminescent device, and more particularly relates to an electroluminescent device and a light-emitting layer and application thereof.

BACKGROUND

Nano-crystalline semiconductor material, also known as nano-crystal, consists of a limited number of atoms, and has at least two dimension sizes in a nanometer order of magnitude. The appearance is like a tiny dot or a rod/line. The electron motion inside is limited in a two-dimensional space. The quantum confinement effect is very obvious. When being excited by light or electricity, the nano-crystalline semiconductor material will give out a spectrum with a very narrow half-peak breadth (generally, the half-peak breadth is less than 40 nm). The light-emitting color is mainly determined by the particle size. The light emission has the characteristics of high light color purity, high light-emitting quantum efficiency, stable performance and the like.

The nano-crystalline semiconductor material has huge application potential in a next generation display technology due to advantages of high light-emitting efficiency, controllable light-emitting color, high color purity and the like. Exciting modes generally include a photoluminescence mode and an electroluminescence mode. In the photoluminescence mode, a blue light LED is mainly used as an exciting light source to be applied to the illumination field, LCD display backlight modules and the like. An electroluminescent device can be applied to the fields of illumination and display, and especially has a broader prospect in the display application.

As a burgeoning luminescent device, the electroluminescent device made of the nano-crystalline semiconductor material receives wide attention in recent years. Typically, the electroluminescent device at least includes a first electrode layer, a second electrode layer and a light-emitting layer between the first electrode layer and the second electrode layer. Due to the characteristics of the quantum confinement effect, an electroluminescent diode with a light-emitting layer prepared from the nano-crystalline semiconductor material is also referred to as QLED (Q represents the meaning of quantum, and a specific light-emitting material may include a dotted, rod-shaped or linear material).

Compared with a conventional OLED, the QLED has the characteristics of excellent color purity, brightness, visibility angle and the like. The nano-crystalline semiconductor material can be dispersed into a solvent to be prepared into a printing material (e.g., ink), is suitable for preparation by a solution method, can be used for manufacturing light-emitting films by printing, transfer printing, spin coating and scrape coating and other methods, and realizes large-area solution processing. If a Drop on Demand process similar to an Inkjet Printing process is used, a light-emitting material can be precisely deposited in a set position according to the required quantity to from a precise pixel film structure through deposition, thus manufacturing a large-size colored QLED display screen. Through such characteristics, the QLED with the light-emitting layer made of the nano-crystalline semiconductor material has wide application prospects in the fields of solid state lighting, panel display and the like, and receives wide attention in academic circles and industrial circles.

Through improvement of the nano-crystalline semiconductor material and continuous optimization of the QLED device structure, the performance of an existing QLED device is greatly improved, but its light-emitting efficiency has not yet reached the industrialized production requirement.

SUMMARY

Accordingly, it is necessary to provide a light-emitting layer of an electroluminescent device. The light-emitting layer uses a nano-crystalline semiconductor material, and the light-emitting efficiency is high, which is convenient for the industrialized production and application.

The light-emitting layer of the electroluminescent device includes at least one nano-crystalline semiconductor material and at least one exciplex.

An emission spectrum of the exciplex is at least partially overlapped with an excitation spectrum of the nano-crystalline semiconductor material, and a decay lifetime of an excited state of the exciplex is greater than a decay lifetime of an excited state of the nano-crystalline semiconductor material.

The principles and advantages of the present disclosure are as follows.

Based on advantages of the nano-crystalline semiconductor material, in order to improve the light-emitting efficiency of an electroluminescent diode (QLED) with the light-emitting layer made of the nano-crystalline semiconductor material, the present disclosure performs a great deal of study and analysis.

Firstly, an HTL and an ETL of an OLED are used directly to match with the light-emitting layer of the QLED device, but the performance is found not ideal. The reasons are that an HOMO and an LUMO of the nano-crystalline semiconductor material are deep, there is a huge efficiency difference between injection of holes and electrons into the light-emitting layer, and the electron and hole quantities in the light-emitting layer are unbalanced, which result in instability and failure of the material. Therefore, it is concluded that one major reason that the lifetime of the existing QLED device is relatively short may be the serious unbalance of a current carrier concentration in the light-emitting layer. Therefore, if a proper auxiliary material is introduced into the light-emitting layer to accept the injection of the hole and the electron, the hole and electron quantities in the light-emitting layer may be well balanced. However, there is still a key problem needing to be solved, i.e., how to effectively transfer energy from the newly introduced auxiliary material to the nano-crystalline semiconductor material.

Additionally, the nano-crystalline semiconductor material has been successfully applied to a color filter/color conversion film, it indicates that the nano-crystalline semiconductor material has good stability, which essentially means that the energy of the nano-crystalline semiconductor material relative to a (singlet state) exciton is very stable. Therefore, if electrons and holes can be combined on an energy donor material to form the exciton, then the energy of the exciton on the energy donor material is transferred to the nano-crystalline semiconductor material, and the nano-crystalline semiconductor material is used as an energy acceptor, it is hopeful to obtain the efficient and stable QLED device.

Based on the above, finding the energy donor material capable of effectively transferring the energy to the nano-crystalline semiconductor material is the key to the improvement of the QLED light-emitting efficiency. Through study and analysis by the inventors, it is found that the effective energy transfer from the energy donor material to the nano-crystalline semiconductor material in a Förster resonance energy transfer (FRET) mode needs to satisfy the following two key conditions.

(1) An emission spectrum of the energy donor material is greatly overlapped with an excitation spectrum of the nano-crystalline semiconductor material.

(2) A decay lifetime of an excited state of the energy donor material should be much greater than the decay lifetime of the excited state of the nano-crystalline semiconductor material.

For the first condition, typically, the nano-crystalline semiconductor material has a wide excitation spectrum, such that the energy donor material with an emission spectrum greatly overlapped with the excitation spectrum of the nano-crystalline semiconductor material can be easily found.

The second condition is the key and main challenge to improve the performance of the QLED device. Most of main materials used in previous reports cannot effectively use or transfer all energy in the electroluminescent device, and the efficiency of the device is poor. The analysis by the inventors finds that the reasons mainly lie in that on one hand, most organic dyes can only use singlet state energy in the electroluminescent device, and triplet state energy cannot emit light or perform effective energy transfer due to forbidden transition; and on the other hand, the lifetime of the fluorescence excited state of the nano-crystalline semiconductor material is at the level ns, the decay lifetime of the singlet state of most organic materials is also at the level ns (e.g., PVK), which cannot satisfy the second condition of performing effective energy transfer, such that most organic materials are not good main materials for the nano-crystalline semiconductor material.

Based on the above study, the present disclosure creatively applies an exciplex capable of forming delayed fluorescence to the light-emitting layer made of the nano-crystalline semiconductor material. The decay lifetime of the excited state of the exciplex is greater than the decay lifetime of the excited state of the nano-crystalline semiconductor material, and the emission spectrum of the exciplex is at least partially overlapped with the excitation spectrum of the nano-crystalline semiconductor material, which meets the two key conditions. Meanwhile, the exciplex capable of forming the delayed fluorescence can simultaneously use the singlet state energy and the triplet state energy in the electroluminescent device at high efficiency, thus further improving the light-emitting efficiency of the device. Therefore, in a light-emitting process of the light-emitting layer of the present disclosure, the exciplex forming the delayed fluorescence can avoid or reduce the direct injection of the holes and electrons into the nano-crystalline semiconductor material with a deeper energy level, and effectively transfers the energy to the nano-crystalline semiconductor material, thus obtaining the light-emitting layer that is stable and high in light-emitting efficiency of the QLED device.

Additionally, the exciplex capable of forming the delayed fluorescence has completely different light-emitting mechanisms from a conventional delayed fluorescence material of a monomolecular structure. Each of two organic materials forming the exciplex per se does not have a delayed fluorescence property, i.e., each of the two organic materials forming the exciplex per se is not a delayed fluorescence material, while the two organic materials forming the exciplex can generate delayed fluorescence only under an coexisting condition. A light-emitting process of the delayed fluorescence material of the monomolecular structure involves charge transfer in molecules, and a light-emitting process of a delayed fluorescence exciplex involves charge transfer between different molecules. Additionally, compared with the delayed fluorescence material of the monomolecular structure, the exciplex exhibits higher flexibility and has the following advantages: relative concentrations of the electrons and the holes in the light-emitting layer can be regulated by adjusting a ratio of two organic molecules forming the exciplex, so as to obtain the balance of charges in the light-emitting layer; when the delayed fluorescence material of the monomolecular structure with a great energy band gap (e.g., a blue light-emitting delayed fluorescence material) is excited, the charge transfer in the molecules may cause facture of chemical bonds in molecules and failure of the material, while no chemical bond exists between the two organic materials forming the delayed fluorescence exciplex, such that the charge transfer between two types of molecules cannot cause the fracture of the chemical bonds.

In the present disclosure, when the excited states of the exciplex and the nano-crystalline semiconductor material each have multiple decay lifetime values, the decay lifetime of the excited state of the exciplex being greater than the decay lifetime of the excited state of the nano-crystalline semiconductor material refers to that a decay lifetime of a slow decay process of the exciplex is greater than a decay lifetime of a fast decay process of the nano-crystalline semiconductor material.

In one embodiment, the decay lifetime of the excited state of the exciplex is more than 5 times of the decay lifetime of the excited state of the nano-crystalline semiconductor material, and in one embodiment more than 10 times.

In one embodiment, the decay lifetime of the excited state of the nano-crystalline semiconductor material ranges from 1 ns to 100 ns, and the decay lifetime of the excited state of the exciplex ranges from 0.5 µs to 100 µs.

In the present disclosure, when a fast process and a slow process coexist in a de-excitation process of the exciplex, the decay lifetime of the excited state of the exciplex refers to a decay lifetime being no lower than 1 µs in the slow process.

In one embodiment, an energy level difference between the singlet state and the triplet state of the exciplex is less than 0.5 eV, and in one embodiment less than 0.3 eV.

In one embodiment, an emission peak value wavelength of the exciplex is less than that of the nano-crystalline semiconductor material so as to further ensure the energy transfer.

In one embodiment, the exciplex consists of two organic materials. The triplet state energy level of each of the two organic materials is higher than the triplet state energy level of the exciplex. The two organic materials consisting the delayed fluorescence exciplex has good transport capability to the electrons and the holes, so that good current carrier balance can be obtained in the electroluminescent device, and the light-emitting efficiency is improved.

In one embodiment, a molecular structure of one organic material of the two organic materials comprises at least one electron donor, and a molecular structure of the other organic material of the two organic materials comprises at least one electron acceptor.

In one embodiment, the electron donor is optionally selected from a carbazole group with or without a substituent group, an aromatic amine group with or without a substituent group, a phenoxazine group with or without a substituent group, a phenothiazine group with or without a substituent group, a 9,10-dihydracridine group with or without a substituent group, an indolocarbazole group with or without a substituent group, and an indenocarbazole group with or without a substituent group. The substituent group of any one above-mentioned group may be cyclic or non-cyclic.

The electron acceptor is optionally selected from a nitrile group, a carbonyl group with or without a substituent group, a benzophenone group with or without a substituent group, a sulfonyl group with or without a substituent group, a phosphinyl group with or without a substituent group, a triazine group with or without a substituent group, a pyridine group with or without a substituent group, a pyrimidine group with or without a substituent group, a pyrazine group with or without a substituent group, an oxadiazole group with or without a substituent group, a triazole group with or without a substituent group, a xanthone group with or without a substituent group, an imidazole group with or without a substituent group, a thiazole group with or without a substituent group, an oxazole group with or without a substituent group, and a 9H-thioxanthen-9-one 10,10-dioxide group with or without a substituent group. The substituent group of any one above-mentioned group may be cyclic or non-cyclic.

In one embodiment, the electron donor is optionally selected from the carbazole group with or without a substituent group, and the aromatic amine group with or without a substituent group. The electron acceptor is optionally selected from the phosphinyl group with or without a substituent group, the triazine group with or without a substituent group, and the pyridine group with or without a substituent group.

In one embodiment, the electron donor and the electron acceptor is/are substituted on an aromatic compound. In one embodiment, the electron donor or the electron acceptor is substituted on an aromatic compound. In one embodiment, the aromatic compound is benzene.

In one embodiment, a mole ratio (or a molecule number ratio) of the two organic materials forming the delayed fluorescence exciplex is 3:7 to 7:3, and in one embodiment, the mole ratio is 5:5.

In one embodiment, the nano-crystalline semiconductor material is optionally selected from one, two, three or more of a II-VI group nano-crystalline semiconductor material, a III-V group nano-crystalline semiconductor material, a IV-VI group nano-crystalline semiconductor material, a nano-crystalline semiconductor material with a perovskite crystal type, and a nano-crystalline semiconductor material consisting of a single or various carbon group elements.

In one embodiment, the nano-crystalline semiconductor material is optionally selected from one, two, three or more of CdSe, CdS, ZnSe, ZnS, CdTe, ZnTe, CdZnS, CdZnSe, CdZnTe, ZnSeS, ZnSeTe, ZnTeS, CdSeS, CdSeTe, CdTeS, CdZnSeS, CdZnSeTe, CdZnSTe, CdSeSTe, ZnSeSTe, and CdZnSeSTe in II-VI group; InP, InAs and InAsP in III-V groups; PbS, PbSe, PbTe, PbSeS, PbSeTe and PbSTe in IV-VI group. An organic metal halide semiconductor material $ABX_3$ with a perovskite crystal structure type, wherein A is an organic group (including but not limited to $CH_3NH_3$, $CH_3CH_2NH_3$ and $NH_2CH=NH_2$) or an alkali metal element (including but not limited to K, Rb and Cs), B is a metal element (including but not limited to Pb), and X is a halogen group element (including but not limited to Cl, Br and I); and carbon nano-crystals, silicon nano-crystals and silicon carbide nano-crystals.

In one embodiment, the nano-crystalline semiconductor material is of a core-shell type, including a single-core structure and a multi-core structure. It specifically includes: a single-core structure of a uniform one-element ingredient (refers to the ingredient consisting of one element), a single-core structure of a uniform two-element ingredient (refers to the ingredient consisting of two elements), a single-core structure of a uniform multi-element ingredient (refers to the ingredient consisting of three or more than three elements), a single-core structure of a multi-element ingredient with a gradual element concentration, a discrete core-shell structure of a two-element ingredient, a discrete core-shell structure of a multi-element ingredient, and a gradual core-shell structure of a multi-element ingredient.

In one embodiment, a mass percentage of the nano-crystalline semiconductor material in the light-emitting layer ranges from 1% to 99%, and in one embodiment ranges from 40% to 90%.

In one embodiment, an outside of the nano-crystalline semiconductor material may include an organic ligand, so as to be dissolved in a low-polarity solvent. The organic ligand includes but is not limited to one or more of an acid ligand, a thiol ligand, an amine ligand, a (oxy)phosphine ligand, phospholipid, phosphatidylcholine, polyvinyl pyridine and the like. The acid ligand includes one or more of capric acid, undecylenic acid, myristic acid, oleic acid and stearic acid. The thiol ligand includes one or more of octanethiol, dodecanethiol and octadecanethiol. The amine ligand includes one or more of oleylamine, octadecylamine and octylamine. The (oxy)phosphine ligand includes one or more of tri-n-octylphosphine and trioctylphosphine oxide.

In one embodiment, an outside of the nano-crystalline semiconductor material may include an organic ligand, so as to be dissolved in water or other high-polarity solvents. The ligand includes but is not limited to one or more of a mercapto acid ligand and a mercaptoalcohol ligand. The mercapto acid ligand includes one or more of mercaptoacetic acid, 2-mercaptopropionic acid, 3-mercaptopropionic acid, 3-mercaptobenzoic acid, 4-mercaptobenzoic acid, 6-mercaptohexanoic acid, DL-mercaptosuccinic acid, 11-mercaptoundecanoic acid, 12-mercaptododecanoic acid, and 16-mercaptohexadecanoic acid. The mercaptoalcohol ligand includes one or more of 2-mercaptoethanol, 1-thioglycerol, 3-mercapto-2-butanol, 4-mercapto-1-butanol, 6-mercapto-1-hexanol, 8-mercapto-1-octanol, 9-mercapto-1-nonanol and 11-mercapto-1-undecanol.

In one embodiment, a thickness of the light-emitting layer ranges from 10 to 150 nm.

The light-emitting layer of the present disclosure includes one light-emitting film layer. In another embodiment, the light-emitting layer of the present disclosure includes two or three light-emitting film layers laminated sequentially. Each light-emitting film layer may be made of a single material, and may also be made of multiple materials through blending.

The exciplex and the nano-crystalline semiconductor material may be positioned in the same light-emitting film layer and may also be positioned in different light-emitting film layers. When the exciplex and the nano-crystalline semiconductor material are respectively positioned in different light-emitting film layers, a vertical distance between the light-emitting film layer where the exciplex is located and the light-emitting film layer where the nano-crystalline semiconductor material is located is no greater than 10 nm.

The nano-crystalline semiconductor material of the present disclosure refers to a crystalline semiconductor material with a size being at orders of 1 nm to 30 nm in at least two dimensions. According to a size of the nano-crystalline semiconductor material in a third dimension, a dotted quantum dot material, a rod-shaped quantum rod material or a linear quantum line material is included. The exciplex forming delayed fluorescence refers to that the exciplex has a delayed fluorescence property in light emission.

The present disclosure further provides an electroluminescent device having the aforementioned light-emitting layer. The light-emitting layer includes at least one nano-crystalline semiconductor material and at least one exciplex, wherein an emission spectrum of the exciplex is at least partially overlapped with an excitation spectrum of the nano-crystalline semiconductor material, and a decay lifetime of an excited state of the exciplex is greater than a decay lifetime of an excited state of the nano-crystalline semiconductor material.

The electroluminescent device of the present disclosure can form energy transfer in a light-emitting process by using the light-emitting layer. In the energy transfer process, the energy can be effectively transferred from the exciplex forming the delayed fluorescence to the nano-crystalline semiconductor material. Meanwhile, two organic materials forming the exciplex are favorable for balancing the quantities of holes and electrons in the light-emitting layer. Therefore, the electroluminescent device has the advantages of high efficiency and stability.

In one embodiment, the electroluminescent device includes a first electrode layer, a light-emitting layer, and a second electrode layer, which are laminated sequentially.

In one embodiment, a function layer is further provided between the first electrode layer and the second electrode layer. The function layer is one or more of a hole injection layer, a hole transport layer, an electron blocking layer, a hole blocking layer, an electron transport layer and an electron injection layer. A position relationship between the function layer and the light-emitting layer can be set according to conventional conditions.

The present disclosure further provides a display or illumination device having an electroluminescent device. The electroluminescent device has a light-emitting layer. The light-emitting layer includes at least one nano-crystalline semiconductor material and at least one exciplex, wherein an emission spectrum of the exciplex is at least partially overlapped with an excitation spectrum of the nano-crystalline semiconductor material, and a decay lifetime of an excited state of the exciplex is greater than a decay lifetime of an excited state of the nano-crystalline semiconductor material.

BRIEF DESCRIPTION OF THE DRAWINGS

FIG. 1 is a schematic diagram of an electroluminescent device according to one embodiment of the present disclosure.

DETAILED DESCRIPTION OF THE EMBODIMENTS

An electroluminescent device and a light-emitting layer and application thereof are further illustrated in detail with reference to specific embodiments hereafter.

In the present embodiment, a structure of the electroluminescent device is shown in FIG. 1, and includes a first electrode layer 101, a hole injection layer 104, a hole transport layer or an electron blocking layer 105, a light-emitting layer 103, an electron transport layer or a hole blocking layer 106, an electron injection layer 107, and a second electrode layer 102, which are laminated sequentially on a substrate 100.

Information of materials used is shown as follows:

PEDOT:PSS is Poly(3,4-ethylenedioxythiophene)-poly(styrene-sulfonate);

PVK is Poly(9-vinylcarbazole);

CdSe/ZnS quantum dot refers to a dotted nano-crystalline semiconductor material using CdSe as a core and ZnS as a shell; and CdSe/ZnS quantum rod refers to a rod-shaped nano-crystalline semiconductor material using CdSe as a core and ZnS as a shell.

Structures of organic materials are shown as below:

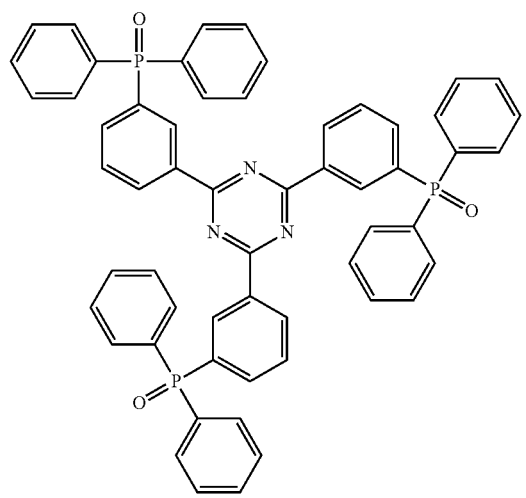

PO-T2T

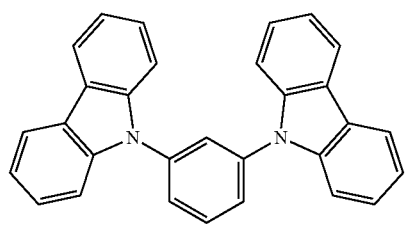

mCP

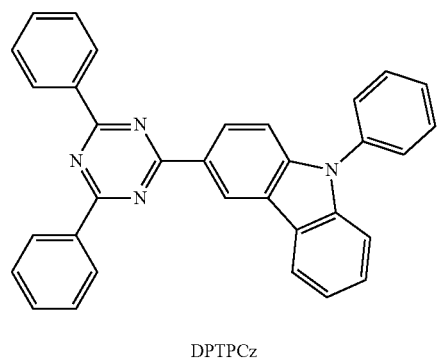

DPTPCz

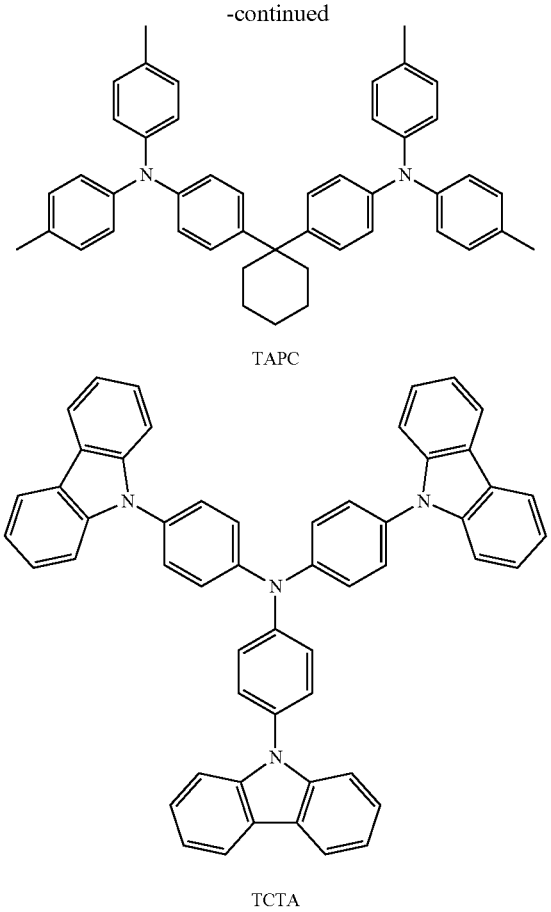

TAPC

TCTA

EXAMPLE 1

An electroluminescent device according to this embodiment has the following structure:

ITO/PEDOT:PSS/PVK/PO-T2T:mCP:(CdSe/ZnS quantum dot)/PO-T2T/LiF/Al.

A light-emitting layer uses PO-T2T (a triplet state energy level being 2.99 eV) and mCP (a triplet state energy level being 2.94 eV) as organic materials to form a delayed fluorescence exciplex (a triplet state energy level being about 2.67 eV, a singlet state energy level being about 2.60 eV, and an emission spectrum being in a blue light wave band).

The CdSe/ZnS quantum dot is used as a nano-crystalline semiconductor material, an excitation spectrum covers ultraviolet to green light wave bands, and an emission spectrum is in a red light wave band.

A decay lifetime (about 500 ns) of an excited state of the exciplex is 10 times of a decay lifetime (about 50 ns) of an excited state of the nano-crystalline semiconductor material.

The electroluminescent device is prepared by the following steps.

(1) Treatment of substrate: cleaning a surface of a substrate sequentially by a glass cleaning agent and pure water, blow-drying by nitrogen gas, then baking at 150° C. for 1 h, and performing UV treatment for 5 min in an atmospheric environment to obtain the clean substrate and an ITO surface.

(2) Preparation of hole injection layer: performing spin coating of PEDOT:PSS ink at a rotating speed of 3000 rpm/min for 30 s, and then baking for 15 min at 110° C. to obtain a hole injection layer film.

(3) Preparation of hole transport layer: performing spin coating of PVK ink (5 mg/ml) at a rotating speed of 1500 rpm/min for 30 s, and then baking for 30 min at 150° C. to obtain a hole transport layer film.

(4) Preparation of light-emitting layer: dissolving a mixture of PO-T2T (9.1 mg/ml), mCP (4.1 mg/ml) and CdSe/ZnS quantum dots (16 mg/ml) into chlorobenzene to form light-emitting layer ink, performing spin coating of the light-emitting layer ink at a rotating speed of 1000 rpm for 30 s, and then baking for 20 min at 150° C. to obtain a light-emitting layer film.

(5) Preparation of electron transport layer, electron injection layer and cathode: sequentially evaporating PO-T2T (40 nm), LiF (1 nm) and Al (150 nm) in an evaporation mode to sequentially form an electron transport layer, an electron injection layer and a cathode.

COMPARATIVE EXAMPLE 1

An electroluminescent device using exciplex-free pure QD as a light-emitting layer according to this comparative example has the following structure:

ITO/PEDOT:PSS/PVK/(CdSe/ZnS quantum dot)/PO-T2T/LiF/Al.

The preparation of the electroluminescent device is similar to that in Example 1. The difference is that the light-emitting layer is of a (CdSe/ZnS quantum dot) nano-crystalline semiconductor material.

EXAMPLE 2

An electroluminescent device according to this embodiment has the following structure:

ITO/PEDOT:PSS/PVK/PO-T2T:mCP:(CdSe/ZnS quantum rod)/PO-T2T/LiF/Al.

A light-emitting layer uses PO-T2T (a triplet state energy level being 2.99 eV) and mCP (a triplet state energy level being 2.94 eV) as organic materials to form a delayed fluorescence exciplex (a triplet state energy level being about 2.67 eV, a singlet state energy level being about 2.60 eV, and an emission spectrum being in a blue light wave band).

The CdSe/ZnS quantum rod is used as a nano-crystalline semiconductor material, an excitation spectrum covers ultraviolet to green light wave bands, and an emission spectrum is in a red light wave band.

A decay lifetime (about 500 ns) of an excited state of the exciplex is 25 times of a decay lifetime (about 20 ns) of an excited state of the quantum rod of the nano-crystalline semiconductor material.

The preparation of the electroluminescent device is similar to that in Example 1. The difference is that the CdSe/ZnS quantum dot in Example 1 is replaced with the CdSe/ZnS quantum rod.

EXAMPLE 3

An electroluminescent device according to this embodiment has the following structure:

ITO/PEDOT:PSS/PVK/DPTPCz:TAPC:(CdSe/ZnS quantum dot)/PO-T2T/LiF/Al.

A light-emitting layer uses DPTPCz (a triplet state energy level being 2.77 eV) and TAPC (a triplet state energy level being 2.91 eV) as organic materials to form a delayed fluorescence exciplex (a triplet state energy level being 2.47 eV, a singlet state energy level being 2.52 eV, and an emission spectrum being in a green light wave band).

The CdSe/ZnS quantum dot is used as a nano-crystalline semiconductor material, an excitation spectrum covers ultraviolet to green light wave bands, and an emission spectrum is in a red light wave band.

A decay lifetime (about 2 μs) of an excited state of the exciplex is 40 times of the decay lifetime (about 50 ns) of an excited state of the nano-crystalline semiconductor material.

The electroluminescent device is prepared by the following steps.

(1) Treatment of substrate: cleaning a surface of a substrate sequentially by a glass cleaning agent and pure water, blow-drying by nitrogen gas, then baking at 150° C. for 1 h, and performing UV treatment for 5 min in an atmospheric environment to obtain the clean substrate and an ITO surface.

(2) Preparation of hole injection layer: performing spin coating of PEDOT:PSS ink at a rotating speed of 3000 rpm/min for 30 s, and then baking for 15 min at 110° C. to obtain a hole injection layer film.

(3) Preparation of hole transport layer: performing spin coating of PVK ink (5 mg/ml) at a rotating speed of 1500 rpm/min for 30 s, and then baking for 30 min at 150° C. to obtain a hole transport layer film.

(4) Preparation of light-emitting layer: dissolving a mixture of DPTPCz (4.7 mg/ml), TAPC (6.3 mg/ml) and CdSe/ZnS quantum dots (16 mg/ml) into chlorobenzene to form light-emitting layer ink, performing spin coating of the light-emitting layer ink at a rotating speed of 1000 rpm for 30 s, and then baking for 20 min at 150° C. to obtain a light-emitting layer film.

(5) Preparation of electron transport layer, electron injection layer and cathode: sequentially evaporating PO-T2T (40 nm), LiF (1 nm) and Al (150 nm) in an evaporation mode to sequentially form an electron transport layer, an electron injection layer and a cathode.

EXAMPLE 4

An electroluminescent device according to this embodiment has the following structure:
ITO/PEDOT:PSS/PVK/DPTPCz:TCTA:(CdSe/ZnS quantum dot)/PO-T2T/LiF/Al.

A light-emitting layer uses DPTPCz (a triplet state energy level being 2.77 eV) and TCTA (a triplet state energy level being 2.73 eV) as organic materials to form a delayed fluorescence exciplex (a triplet state energy level being 2.49 eV, a singlet state energy level being about 2.55 eV, and an emission spectrum being in a green light wave band).

The CdSe/ZnS quantum dot is used as a nano-crystalline semiconductor material.

A decay lifetime (about 4.5 μs) of an excited state of the exciplex is 90 times of the decay lifetime (about 50 ns) of an excited state of the nano-crystalline semiconductor material.

The electroluminescent device is prepared by the following steps.

(1) Treatment of substrate: cleaning a surface of a substrate sequentially by a glass cleaning agent and pure water, blow-drying by nitrogen gas, then baking at 150° C. for 1 h, and performing UV treatment for 5 min in an atmospheric environment to obtain the clean substrate and an ITO surface.

(2) Preparation of hole injection layer: performing spin coating of PEDOT:PSS ink at a rotating speed of 3000 rpm/min for 30 s, and then baking for 15 min at 110° C. to obtain a hole injection layer film.

(3) Preparation of hole transport layer: performing spin coating of PVK ink (5 mg/ml) at a rotating speed of 1500 rpm/min for 30 s, and then baking for 30 min at 150° C. to obtain a hole transport layer film.

(4) Preparation of light-emitting layer: dissolving a mixture of DPTPCz (4.7 mg/ml), TCTA (7.4 mg/ml) and CdSe/ZnS quantum dots (16 mg/ml) into chlorobenzene to form light-emitting layer ink, performing spin coating of the light-emitting layer ink at a rotating speed of 1000 rpm for 30 s, and then baking for 20 min at 150° C. to obtain a light-emitting layer film.

(5) Preparation of electron transport layer, electron injection layer and cathode: sequentially evaporating PO-T2T (40 nm), LiF (1 nm) and Al (150 nm) in an evaporation mode to sequentially form an electron transport layer, an electron injection layer and a cathode.

The devices in the above-mentioned examples and comparative example are subjected to device current efficiency test at a current density of 10 mA/cm$^2$. The current efficiency of Comparative example 1 is normalized into 1, corresponding current efficiency values are obtained, and the results are shown as follows:

|  | Composition of light-emitting layer | Current efficiency |
| --- | --- | --- |
| Comparative example 1 | CdSe/ZnS quantum dot | 1 |
| Example 1 | PO-T2T:mCP:CdSe/ZnS quantum dot | 4 |
| Example 2 | PO-T2T:mCP:CdSe/ZnS quantum rod | 4.5 |
| Example 3 | DPTPCz:TAPC:CdSe/ZnS quantum dot | 3 |
| Example 4 | DPTPCz:TCTA:CdSe/ZnS quantum dot | 3 |

EXAMPLE 5

An electroluminescent device according to this embodiment has the following structure:
ITO/PEDOT:PSS/PVK/PO-T2T:mCP:(CsPbBr$_3$ quantum dot)/PO-T2T/LiF/Al.

A light-emitting layer uses PO-T2T (a triplet state energy level being 2.99 eV) and mCP (a triplet state energy level being 2.94 eV) as organic materials to form a delayed fluorescence exciplex (a triplet state energy level being about 2.67 eV, a singlet state energy level being about 2.60 eV, and an emission spectrum being in a blue light wave band).

The CsPbBr$_3$ quantum dot is used as a nano-crystalline semiconductor material, an excitation spectrum covers ultraviolet to blue light wave bands, and an emission spectrum is in a green light wave band.

A decay lifetime (about 500 ns) of an excited state of the exciplex is about 20 times of a decay lifetime (about 25 ns) of an excited state of the nano-crystalline semiconductor material.

The electroluminescent device is prepared by the following steps.

(1) Treatment of substrate: cleaning a surface of a substrate sequentially by a glass cleaning agent and pure water, blow-drying by nitrogen gas, then baking at 150° C. for 1 h, and performing UV treatment for 5 min in an atmospheric environment to obtain the clean substrate and an ITO surface.

(2) Preparation of hole injection layer: performing spin coating of PEDOT:PSS ink at a rotating speed of 3000 rpm/min for 30 s, and then baking for 15 min at 110° C. to obtain a hole injection layer film.

(3) Preparation of hole transport layer: performing spin coating of PVK ink (5 mg/ml) at a rotating speed of 1500 rpm/min for 30 s, and then baking for 30 min at 150° C. to obtain a hole transport layer film.

(4) Preparation of light-emitting layer: dissolving a mixture of PO-T2T (9.1 mg/ml), mCP (4.1 mg/ml) and $CsPbBr_3$ quantum dots (16 mg/ml) into chlorobenzene to form light-emitting layer ink, performing spin coating of the light-emitting layer ink at a rotating speed of 1000 rpm for 30 s, and then baking for 20 min at 150° C. to obtain a light-emitting layer film.

(5) Preparation of electron transport layer, electron injection layer and cathode: sequentially evaporating PO-T2T (40 nm), LiF (1 nm) and Al (150 nm) in and evaporation mode to sequentially form an electron transport layer, an electron injection layer and a cathode.

COMPARATIVE EXAMPLE 2

An electroluminescent device using exciplex-free pure QD as a light-emitting layer according to this comparative example has the following structure: ITO/PEDOT:PSS/PVK/($CsPbBr_3$ quantum dot)/PO-T2T/LiF/Al.

The preparation of the electroluminescent device is similar to that in Example 5. The difference is that the light-emitting layer is of a ($CsPbBr_3$ quantum dot) nano-crystalline semiconductor material.

The devices in the above-mentioned example and comparative example are subjected to device current efficiency test at a current density of 10 $mA/cm^2$. The current efficiency of Comparative example 2 is normalized into 1, corresponding current efficiency values are obtained and the results are shown as follows:

| | Composition of light-emitting layer | Current efficiency |
|---|---|---|
| Comparative example 2 | $CsPbBr_3$ quantum dot | 1 |
| Example 5 | PO-T2T:mCP:$CsPbBr_3$ quantum dot | 3 |

Various technical features in the foregoing embodiments may be combined randomly. For ease of description, possible combinations of various technical features in the foregoing embodiments are not all described. However, the combinations of the technical features should be considered as falling within the scope recorded in this specification provided that the combinations of the technical features are compatible with each other.

The foregoing embodiments only describe several implementations of the present disclosure, and their description is specific and detailed, but cannot therefore be understood as a limitation to the patent scope of the present disclosure. It should be noted that, a person of ordinary skill in the art may make various changes and improvements without departing from the ideas of the present disclosure, which shall fall within the protection scope of the present disclosure. Therefore, the protection scope of the patent of the present disclosure shall be topic to the claims.

What is claimed is:

1. A light-emitting layer of an electroluminescent device, the light-emitting layer comprising:
at least one nano-crystalline semiconductor material including at least one of CdSe/ZnS quantum dot or $CsPbBr_3$ quantum dot; and
at least one exciplex including at least one of DPTPCz:TAPC or DPTPCz:TCTA;
wherein an emission spectrum of the at least one exciplex is at least partially overlapped with an excitation spectrum of the at least one nano-crystalline semiconductor material, and a decay lifetime of an excited state of the exciplex is greater than a decay lifetime of an excited state of the at least one nano-crystalline semiconductor material; and an emission peak value wavelength of the exciplex is less than that of the at least one nano-crystalline semiconductor material.

2. The light-emitting layer of the electroluminescent device according to claim 1, wherein the decay lifetime of the excited state of the exciplex is more than 5 times of the decay lifetime of the excited state of the at least one nano-crystalline semiconductor material.

3. The light-emitting layer of the electroluminescent device according to claim 2, wherein the decay lifetime of the excited state of the at least one nano-crystalline semiconductor material is in a range from 1 ns to 100 ns, and the decay lifetime of the excited state of the exciplex is in a range from 0.5 μs to 100 μs.

4. The light-emitting layer of the electroluminescent device according to claim 1, wherein an energy level difference between a singlet state and a triplet state of the exciplex is less than 0.5 eV.

5. The light-emitting layer of the electroluminescent device according to claim 1, wherein a mole ratio of DPTPCz to TAPC or TCTA consisting of the exciplex is 3:7 to 7:3.

6. The light-emitting layer of the electroluminescent device according to claim 1, wherein a mass percentage of the at least one nano-crystalline semiconductor material in the light-emitting layer is in a range from 1% to 99%.

7. An electroluminescent device, comprising:
a light-emitting layer including:
at least one nano-crystalline semiconductor material including at least one of CdSe/ZnS quantum dot or $CsPbBr_3$ quantum dot; and
at least one exciplex including at least one of DPTPCz:TAPC or DPTPCz:TCTA;
wherein an emission spectrum of the exciplex is at least partially overlapped with an excitation spectrum of the at least one nano-crystalline semiconductor material, and a decay lifetime of an excited state of the exciplex is greater than a decay lifetime of an excited state of the at least one nano-crystalline semiconductor material; and an emission peak value wavelength of the exciplex is less than that of the at least one nano-crystalline semiconductor material.

8. A display or an illumination device, comprising:
an electroluminescent device including:
a light-emitting layer including:
at least one nano-crystalline semiconductor material including at least one of CdSe/ZnS quantum dot or $CsPbBr_3$ quantum dot; and
at least one exciplex including at least one of DPTPCz:TAPC or DPTPCz:TCTA;
wherein an emission spectrum of the exciplex is at least partially overlapped with an excitation spectrum of the at least one nano-crystalline semiconductor material, and a decay lifetime of an excited state of the exciplex is greater than a decay lifetime of an excited state of the at least one nano-crystalline semiconductor material;

and an emission peak value wavelength of the exciplex is less than that of the at least one nano-crystalline semiconductor material.

\* \* \* \* \*